United States Patent [19]
Svendsen et al.

[11] Patent Number: 5,262,718
[45] Date of Patent: Nov. 16, 1993

[54] ANISOTROPICALLY ELECTRICALLY CONDUCTIVE ARTICLE

[75] Inventors: Leo G. Svendsen; Nigel R. Bates, both of Swindon, England

[73] Assignee: Raychem Limited, United Kingdom

[21] Appl. No.: 551,677

[22] Filed: Jul. 10, 1990

Related U.S. Application Data

[63] Continuation of Ser. No. 393,831, Aug. 14, 1989, abandoned, which is a continuation of Ser. No. 233,972, Aug. 18, 1988, abandoned, which is a continuation of Ser. No. 893,855, Aug. 6, 1986, abandoned.

[30] Foreign Application Priority Data

Aug. 5, 1985 [GB] United Kingdom ............... 8519620
Jun. 24, 1986 [GB] United Kingdom ............... 8615425

[51] Int. Cl.$^5$ .................. H05K 1/11; H05K 3/06; C25D 5/54; G01R 1/073
[52] U.S. Cl. .................. 324/158 P; 29/874; 205/125; 439/54
[58] Field of Search .......... 324/158 P, 158 F; 29/874; 205/125; 439/54

[56] References Cited

U.S. PATENT DOCUMENTS

| | | | |
|---|---|---|---|
| 3,303,085 | 2/1967 | Price et al. | 161/109 |
| 3,758,705 | 9/1973 | Schmid | 174/113 R |
| 3,795,037 | 3/1974 | Luttmer | 29/628 |
| 3,862,790 | 1/1975 | Davies et al. | 339/17 LM |
| 3,862,791 | 1/1975 | Miller | 339/198 R |
| 4,003,621 | 1/1977 | Lamp | 339/59 M |
| 4,064,623 | 12/1977 | Moore | 439/86 X |
| 4,199,637 | 4/1980 | Sado | 428/119 |
| 4,252,990 | 2/1981 | Sado | 174/52 R |
| 4,268,956 | 5/1981 | Parks et al. | 29/869 |
| 4,374,003 | 2/1983 | Dugan | 204/11 |
| 4,374,708 | 2/1983 | Dugan | 204/11 |
| 4,504,783 | 3/1985 | Zasio et al. | 324/73 R |
| 4,508,749 | 4/1985 | Brannon et al. | 427/43.1 |
| 4,566,184 | 1/1986 | Higgins et al. | 29/840 |
| 4,568,632 | 2/1986 | Blum et al. | 430/322 |
| 4,649,338 | 3/1987 | Dugan | 324/158 P |

FOREIGN PATENT DOCUMENTS

| | | |
|---|---|---|
| 72673A | 2/1983 | European Pat. Off. . |
| 106990A | 9/1983 | European Pat. Off. . |
| 147856A | 12/1984 | European Pat. Off. . |
| 160236A | 4/1985 | European Pat. Off. . |
| 221903A | 1/1984 | German Democratic Rep. . |
| 161306 | 12/1980 | Japan . |
| 123478 | 7/1983 | Japan ............... 324/158 F |
| 59-218795A | 12/1984 | Japan . |
| 914839 | 1/1963 | United Kingdom . |
| 1262787 | 2/1972 | United Kingdom . |
| 1284481 | 8/1972 | United Kingdom . |
| 1311659 | 3/1973 | United Kingdom . |
| 2017408A | 3/1979 | United Kingdom . |
| 1545701 | 5/1979 | United Kingdom . |
| 2069251A | 1/1981 | United Kingdom . |
| 1587416 | 4/1981 | United Kingdom . |
| 2149980A | 10/1984 | United Kingdom . |
| 2189657A | 4/1986 | United Kingdom . |

*Primary Examiner*—Stephen M. Baker
*Attorney, Agent, or Firm*—Herbert G. Burkard; Sheri M. Novack

[57] ABSTRACT

Low tortuosity porous polymer sheets (25 to 2000 pores per square millimeter) with metal plated in the pores so as to project beyond sheet surfaces provide uniaxial electrical interconnects. A first "flash" layer of metal is electrolessly plated in the pores and the "flash" coating of metal is then removed from the sheet surface to isolate the pores electrically from one another. Further plating is then applied only to the already plated pore surfaces to fill the pores and/or project beyond the sheet surface. Solder may fill the plated pores. Polymer layers may be removed from the sheets to expose the metal in the pores. The articles are useful in making electrical connections to the contact pads of microcircuits during testing and assembly into electronic devices.

32 Claims, 1 Drawing Sheet

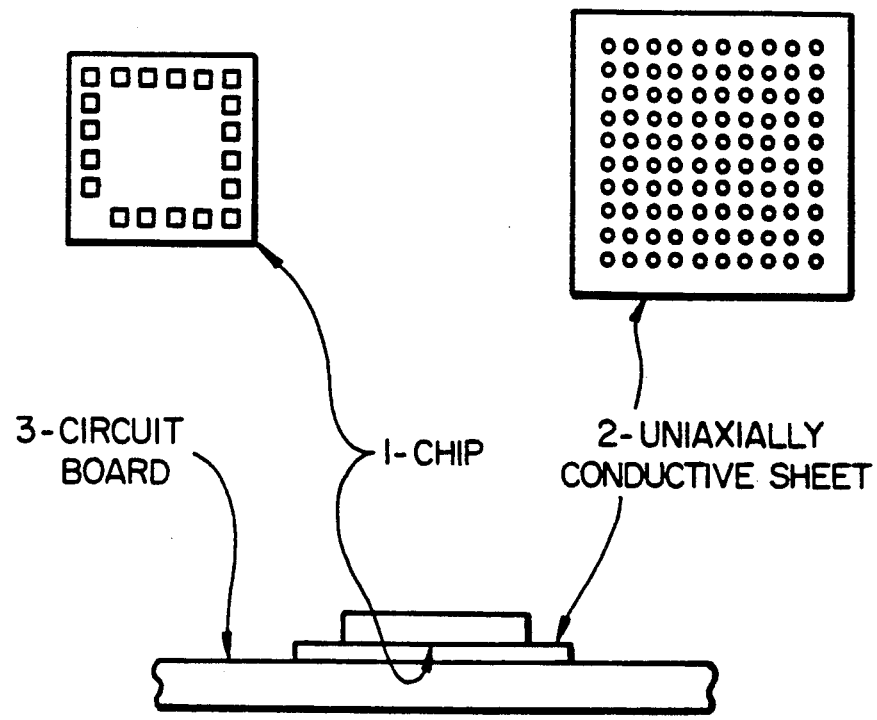
FIG_1
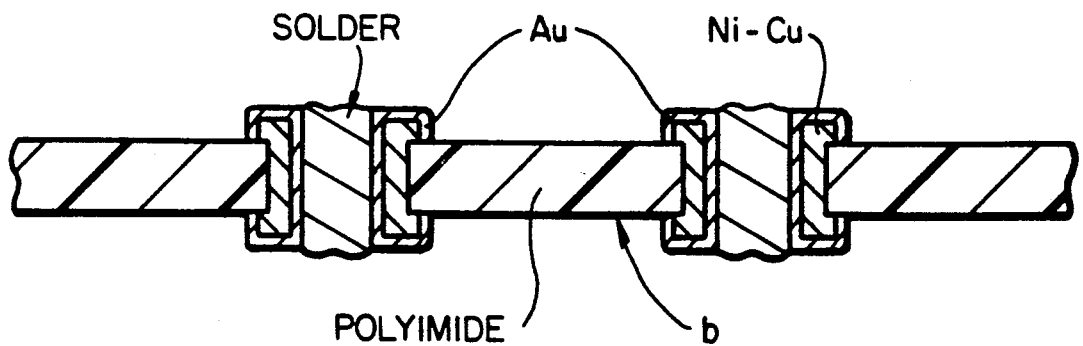
FIG_2

ANISOTROPICALLY ELECTRICALLY CONDUCTIVE ARTICLE

This application is a continuation of Ser. No. 07/393,831 filed Aug. 14, 1989, abandoned, which is a continuation of application Ser. No. 07/233,972 filed Aug. 18, 1988, abandoned, which is a continuation of application Ser. No. 06/893,855 filed Aug. 6, 1986, abandoned.

This invention relates to anisotropically electrically conductive articles and methods of making them.

It is known from U.S. Pat. No. 3303085 to produce porous mica sheets in which relatively straight-line pores of 5 to 20,000 Angstroms diameter, produced by heavy particle radiation followed by etching of the mica, are simply filled with superconductive material or iron particles to provide oriented single domain ferromagnetic sheet, or with material suitable for imaging in television cameras. The surfaces of the mica sheet may be polished or abraded to assure electrical contact with the conductive filler.

Porous polymer sheets in which selected areas of the interconnecting pores are masked and the unmasked pores are metal plated to provide anisotropically electrically conductive spots surrounded by insulating areas, are known from Japanese Published Patent Application 80161306.

DESCRIPTION OF THE DRAWINGS

The invention is further illustrated by the accompanying drawings, in which

FIG. 1 shows schematically a uniaxially conductive sheet 2 according to the present invention, magnified for clarity, in use for connecting the bonding pads on the underside of a microchip 1 to the corresponding bonding pads on the surface of a circuit board 3.

FIG. 2 shows in magnified cross-section one form of structure of the metal-plated through-holes, as obtained after removal of a soluble surface layer to leave the ends of the metal tubes projecting from the sheet b.

The present invention concerns anisotropically electrically conductive articles which tend to provide enhanced electrical contact together with high selectivity, owing to the special arrangement of the electrically conductive material in the pores of a sheet material.

The invention accordingly provides an anisotropically electrically conductive article comprising porous electrically insulating sheet material at least a selected portion of which has at least 25 substantially non-interconnected pores per square millimeter of its surface, at least a significant proportion of which pores individually contain electrically conductive material which provides an electrically conductive path between, and projects beyond at least one of, the main surfaces of the sheet material, each such conductive path being electrically separate from substantially all of the other such conductive paths.

The diameter and distribution of the pores will preferably be such that the pores occupy from 3 to 35 percent, more preferably 10 to 20 percent, of the sheet surface area. Pores of less than 500, e.g. 5 to 150, micrometers diameter are preferred. A sheet with at least 25 pores per square millimeter having plated electrically conductive material (metal) within (preferably substantially only within) the pores is believed to be novel in itself and constitutes another aspect of this invention, the pores thus providing high density electrically conductive paths between the sheet surfaces, each such path being electrically separate from substantially all the other such paths.

While a "significant proportion" of the pores in the selected areas, for example at least 10%, preferably at least 20%, more preferably at least 30% or better still at least 40%, may contain the conductive material, it is preferred that a majority (more than 50%) do so. Proportions of at least 70%, or better still at least 85% are preferred, and in many cases, substantially all of the pores will contain the conductive material. The pores, whether containing the conductive material or not, may be confined to selected areas of the sheet.

The pores may for example be 1 to 200 millimeters in diameter, and it is also preferable that the conductive material project beyond both main surfaces of the sheet material, the projections from either surface preferably being, for example, 0.2 to 100 micrometers in height, preferably 0.5 to 30micrometers.

The insulating sheet material will preferably be a flexible polymeric material, and the number of pores per square millimeter of the sheet material (whether flexible polymeric or not) may be as high as 250000 or 500000, for example, up to 50000, or up to 25000, or up to 10000, but will preferably be in the range from 25 to 2000, more preferably 50 to 1000. The pores will preferably have a tortuosity factor (mean path length/sheet thickness) less than 3, preferably less than 1.2; and will preferably have an aspect ratio (pore length/pore diameter) of at least 2.5.

Although the "electrically conductive" paths between the sheet surfaces may give the sheet an average electrical conductivity in the thickness direction within the semiconductive range, it is preferable to achieve generally metallic levels of conductivity, e.g. at least 1000 Siemens per centimeter, preferably at least 5000 Siemens, especially at least 10000 Siemens per centimeter. The preferred conductive materials are metals, preferably plated, especially electrolessly plated, on the interior surface of the pores. Any suitably applicable metals may be used, for example Ni, Cu, Ag, Au, Co, Pd, Pd-Ni, Sn, Pb, Pb-Sn.

In a preferred form of the articles according to this invention, at least a selected portion of the sheet has a plurality (at least 4, preferably at least 8, more preferably 25 to 1000) of substantially noninterconnected pores per square millimeter of its surface, at least a significant proportion of which pores individually contain a tubular formation of electrically conductive material projecting beyond at least one of the sheet surfaces.

This form of the invention could be used to provide relatively large solder "posts" supported by the tubular formation, for use in making soldered connections to microcircuits. Gold filling material could also be used to make such "permanent" electrical connections.

Preferably, this tubular formation comprises a first portion of electrically conductive material on the interior pore surface, and a second portion of material, which could be electrically insulating (e.g. an adhesive) but is preferably electrically conductive material, on at least one of the end surfaces of the first portion, at least the parts of the second portion on one or both of the end surfaces of the first portion projecting beyond the sheet surface(s). Preferably, the first portion of electrically conductive material on the pore surface is tubular and the second portion of electrically conductive material is on the interior surface as well as the end surface(s) of the first portion. The first portion is preferably metal and is preferably plated, especially electrolessly plated, on the interior pore surface, and the second portion is preferably metal plated, especially electrolessly plated, on the first portion. The first and second portions respectively may comprise different electrically conductive materials, and the second portion may fill the tubular first portion or may itself be tubular, in which case it may be filled with further electrically conductive or insulating material. Where the metal-lined pores are filled with another metal, this will preferably be a solder, a low-melting-point metal, a fusible alloy, or a plated metal. Either the tubular metal lining, or the metal fillings, or both, may project beyond the sheet surface(s), and the other criteria mentioned above may apply as appropriate.

If desired, electrically insulating material may be removed from One or both surfaces of the sheet material to expose portions of the electrically conductive material originally within the pores, thus producing or increasing the desired projections of the conductive material beyond the sheet surface(s). This may be done by any convenient means, for example by dissolving away a surface layer of the sheet material, for which purpose a sheet having surface layers of materials more readily soluble in a selected solvent than the underlying layers may be used.

Any electrically insulating sheet material which is suitably porous may be used, preferred polymeric materials including those acceptable to the electronics industry, for example epoxies, polyurethanes, polyimides, silicone rubbers, polysulphones and polycarbonates. The sheet may carry an adhesive layer on one or both of its surfaces if desired for its intended end use.

The invention includes methods of making the articles in question comprising:

(a) applying a first portion of electrically conductive material to the interior surface of the pores in at least a selected portion of an appropriate porous electrically insulating sheet material, (b) removing any electrically conductive material from at least selected areas of the opposed main surfaces of the sheet material, and (c) applying a second portion of electrically conductive material to at least one of the end surfaces of the first portion, preferably to substantially all accessible surfaces of the first portion.

Sheet material with low tortuosity porous structure acceptable for producing the anisotropic electrically conductive articles may be produced by any convenient method. For example, any method that lends itself to piercing a suitable number of holes in dielectrics can be used. A non-exhaustive list of means to produce pierced sheets is given below:

I. Nuclear track etching: The polymeric sheet is exposed to high energy ion bombardment, either from a nuclear reactor or a high energy particle accelerator, and afterwards etched in a suitable solution. The damage tracks formed by the ions then show up as tubular pores in the sheet. Tubular pores with a hole diameter of 0.1 to 50 micrometers are easily drilled through 5 to 100 micrometer sheets of e.g. polycarbonate or polyimide.

II. Laser drilling: The polymeric sheet is masked and subjected to overall ablation of the exposed areas by laser light of low wavelength (350 to 150 nanometers). Any patterned screen limiting the laser light (e.g. a pierced metal screen) will give rise to the same pattern being reproduced on the polymeric sheet. Tubular pores greater than 5 micrometres in diameter can be produced by this method, and piercing through 0.5 millimeter thick layers is possible by extended exposure of e.g. epoxy, polyurethane, polyimide, or polysulphone sheets. Alternatively, a focussed laser beam of any suitable wavelength could be used to drill individual holes.

III. Punching: The polymeric sheet is placed in a press and metal spikes are forced through it. The method lends itself to any polymer not too brittle, e.g., polysulphone or silicone rubber. Tubular holes 0.1 millimeter in diameter can be produced in 2 millimeter thick sheets by this method.

IV. Re-dissolving: The polymeric sheet contains fibres of a different chemical composition from the base polymer; the fibers are dissolved in a solvent not attacking the base polymer and holes the shape of the fibers are produced. As an example, polyethyleneoxide fibers can be washed out of an epoxy base sheet by alkaline water and produce e.g., 100 micrometer holes in the epoxy sheet. Irradiation could be used to enhance the solubility of the fibers and/or to increase the resistance of the base polymer to the solvent.

Preferred methods of making the articles in question from an insulating sheet material, produced by e.g., one of the above mentioned methods, may comprise, by way of example, the following steps:

a. Rendering the polymeric sheet suitable for electroless plating by conditioning the surface of the sheet with a catalyst.

b. Optionally coating the entire sheet with a thin metal layer by electroless plating.

c. Removing the catalyst (and the thin metal layer if present) from the sheet surface.

d. Electrolessly plating to produce a thicker metal layer in the tubes and to create small projections from the pores.

e. Optionally polishing smooth the ends of the tubes.

f. Optionally:
  Electro or electroless plating in the pores to partially or completely fill the pores with metal; or
  Embedding solder or any fusible low melting metal inside the metal lined pores by, e.g., wave-soldering or capillary absorption or any other suitable method;
  Introducing a non-metal into the metal lined pores, for example a flux or an adhesive,
  Removing electrically insulating material (e.g. a laminate layer) from one or both main surfaces of the sheet material so as to expose portions of the electrically conductive material originally within the pores.

When the pores are to be filled with molten metal, e.g. solder, it is preferred that the tubular layer within the pores be of sufficient thickness, e.g. at least 0.5, preferably 1.0, more preferably at least 3 micrometers, to avoid being completely removed by the pore filling operation.

The aforementioned removal to any electrically conductive material from the sheet surface before application of the second portion of conductive material may be effected by any convenient means. When, as is preferred, a very thin "sheen" or "flash" coating of metal is plated onto the sheet material, this may be removed from the surface by simple friction, e.g. wiping, leaving the metal only in the pores to act as a catalyst or base for commencement of the second application. In practice, below 15% pore area per surface unit area it does not matter whether the holes are in a random pattern (e.g.

made by particle bombardment) or in an ordered pattern (e.g. made by U. V.-laser ablation), but above 15% pore area per surface unit area an ordered pattern is preferred to reduce the risk of overlapping pores. The enormous possible number of cylindrical holes, each with a conductive metallic tube inside, allows a very high number of conductors (vias) between two interconnected devices when the hole diameter is adjusted to the device contact pad size (at least down to 25 sq. micrometer). The large number of vias per pad allows for a very high redundancy if the connection between pad and vias are broken either by bad production of the metallised pores or unfortunate mounting or due to thermal or mechanical shocks. The high potential number of straight through holes combined with the small pore size also allows for a lenient alignment of interconnects made by this method.

The porous sheets may be made of high performance polymers able to withstand severe machanical handling and high temperatures, and may be transparent. When this is the case the sheets are easy to handle, and it is possible to solder the tubes either by having solder inside them from beforehand or by letting solder soak into the tubes during the soldering. Both approaches will give a good electrical connection. The solder connection may give satisfactory bond strength, or this may be enhanced by providing an adhesive layer on the sheet surface or inside the metal tubes. The transparency allows for automatic mounting procedures which us light shone through the screen.

An anisotropic conductive membrane according to the invention may be prepared as described in the following examples:

EXAMPLE

Example 1

A Nuclepore (Trade Mark) polycarbonate capillary screen with 2 micrometer holes and 15% surface porosity is washed in water and methanol and dried.

The rinsed membrane is then soaked in a tin-palladium catalyst leaving both the surface and the holes activated for electroless metal deposition. The sample may then be dried.

The sample is rinsed to remove excessive catalyst in a water bath.

Metal, e.g., Cu, Ni (or Ni-P), Au, Ag and Pd, is now plated electrolessly onto the membrane and inside the membrane pores until there is a shine of transparent metal on the surface.

The membrane is thereafter rubbed or wiped e.g. with a wet cotton cloth so the metal and catalyst is removed from the surface—the metal assists the removal of the catalyst. The membrane is washed in water or methanol or both.

The thickness of the metal layer inside the pores is enhanced by re-applying electroless plating to the membrane until the desired thickness has been reached; at the same time protrusions of approximately the same height as the thickness of the metal wall inside the pores are formed at the pore surfaces. The mechanical removal of the metal and catalyst from the surface ensures that the plating only occurs in this manner. This final plating can be continued to leave practically solid conductors inside the pores or the plating can be stopped and leave metal tubes inside the pores.

If the final plating step is stopped so to leave metal tubes these can be filled with solder or adhesive depending on the requirements. The filling may occur by simple capillary action or may require vacuum or pressure to effect the filling.

Example 2

A 50 micrometre sheet of polycarbonate or polyimide is irradiated with 76 MeV oxygen nuclei from a tandem van de Graaff. The polymer was then etched: polycarbonate in a hot water/ethanol potassium hydroxide solution (6.25 molar), polyimide in a boiling saturated potassium permanganate aqueous solution. The treatment resulted in a polymeric sheet 32 micrometers thick and with 11 micrometer diameter holes.

The sheet was then treated the same way as the Nucle pore (Trade Mark) one in example 1.

Example 3

A polymeric sheet, e.g. polyurethane or epoxy, is exposed to UV-radiation from a high energy laser-source. The setting of an Excimer laser could for example be: wave-length 193 nanometers, pulse energy 300 mJ, repetition rate 120 Hz, beam area 3.22 square centimeter, masking screen 125 micrometer diameter holes 20% porosity 125 micrometer thick reflective stainless steel. The ablation rate would typically be 0.1 to 0.5 micrometers per shot, depending on the number of double-bonds in the polymer and the energy per shot. The present example would produce a pierced polymeric sheet with a 130 micrometer entrance hole (side towards the laser) and a 100 micrometer exit hole in a 450 micrometer thick sheet; this, however, can be altered within wide boundaries, e.g.: hole sizes from 5 to 200 micrometers and thicknesses from 8 to 800 micrometers, as long as one allows for approximately one degree tapering.

The sheet was rinsed in a warm soapy water solution to remove the debris from the drilling process.

The sheet was then treated in a commercial catalyst, Shipley Cataposit 44 (Trade Mark), washed in water and dipped in a commercial accelerator, Shipley Cuposit Accelerator 19 (Trade Mark), and fi ally washed.

The catalytic sheet was plated in a commercial electroless plating bath, Shipley Cuposit CP-78, until a shine of copper appeared on the surface.

The sheet was then removed and the surface polished with a rotary electric cotton polisher to remove the copper and catalyst on the surface. Loose debris from the polishing was washed off in an ultrasonic water bath.

The sheet was then plated in the same copper bath till a thickness of 4 micrometers inside the holes and with a similar protrusion on both sides.

The sheet, with tubular copper lining inside the holes, was run through a wave-soldering apparatus and the eutectic solder filled the holes by means of the capillary forces. On the side facing away from the solder wave the solder stood approximately 25 micrometers proud of the hole; on the side facing the solder wave a similar protrusion occurred but with a more rounded shape of the solder surface. No bridging occurred.

Example 4

A sheet of 310 micrometers thick epoxy was laminated with 64 micrometer thick polycarbonate sheet on both sides. The laminate with a total thickness of 440 micrometer was then treated as in Example 3.

After the holes had been furnished with solder filled copper spikes the polycarbonate was washed away in tetrahydrofuran and the spikes now stood out 88 micrometers on each side.

Example 5

A sheet of 310 micrometers thick polyurethane was laminated with a 40 micrometers hot melt on the surface (PTFE rollers) and the drilling as in Example 3 was carried out holding the sheet only at the edges in a PTFE frame.

Afterwards the procedure in Example 3 was followed, but it was ensured that the sheet was held out from the jig when wave-soldering.

Example 6

A sheet, 425 micrometers thick, mad- of epoxy filled with 40 pphr (parts per hundred resin) phenolic micro balloons had holes drilled by the UV-Laser ablation method mentioned in Example 3. The epoxy sheet henceforth has a tubular porous structure within a closed cell porous structure. This makes the sheet more compliant and more shock resistant when applied in an electrical device.

The sheet was rendered catalytic the same way as described in Example 3, but the plating was commenced in a commercial electroless nickel-copper bath, Shipley Niculoy 22 (Trade Mark), both for the primary sheen plating and the following thickening of the metal tubes.

The metallized tubes were filled with a partially curing contact adhesive by using a silk-screen-printer for the squeezing of adhesive into the pores.

Example 7

A laminate, consisting of five layers: A center polyimide layer, thickness: 75 micrometers, sandwiched between two 25 micrometers thick polysulphone layers and with two outer sacrificial layers of 2 micrometers butyle rubber, is drilled with an excimer laser as specified in example 3, wavelength 308 nm.

The normal aqueous rinsing steps are applied to the drilled sheet; followed by the palladium/tin catalyst and accelerator.

The catalyst and the sacrificial layers are now rubbed off the surfaces to leave catalyst only inside the holes.

Copper is electrolessly plated to 8 micrometers thickness. Afterwards the resulting copper tubes are polished smooth on a one micrometer grit diamond polisher.

The rinsed substrate with polished copper tubes is placed in an electroless gold bath to coat all exposed copper with 0.5 micrometers gold coating.

Finally, the polysulphone is dissolved in dichloromethane leaving a polyimide sheet with smooth-ended 25 micrometer protruding gold plated copper tubes as shown in FIG. 2.

Articles according to this invention may be used in an electrical device or assembly process in which one or more temporary or permanent electrical connections are made by contact with the opposite ends of the electrically conductive material located in the pores as shown in FIG. 1. Testing of microcircuits before or during assembly into electronic devices may especially benefit from the ability of the present articles to make fast, reliable temporary connections between microchip connector pads and the contact pads of a suitable circuit board. Unacceptable chips can thus be rejected before any expensive bonding or connection operations.

We claim:

1. A uniaxially electrically conductive article comprising
   porous electrically insulating sheet material of 8 to 800 micrometers thickness, at least a selected portion of which has
   at least 25 substantially straight-through non-interconnected pores of 1 to 200 micrometers diameter, formed by ultraviolet laser ablation, per square millimeter of its surface,
   at least a significant proportion of which pores individually contain a tubular formation of metal which provides an electrically conductive path between, and projects beyond at least one of, the main surface of the sheet material,
   the metal being substantially only within the pores and each such conductive path being electrically separate from substantially all the other such conductive paths.

2. An article according to claim 1, wherein the tubular formations of metal project beyond both of the main surfaces of the sheet material.

3. An article according to claim 1, wherein the sheet material has 50 to 1000 pores per square millimeter in the selected portion of its surface.

4. An article according to claim 1, wherein electrically insulating material has been removed from one or both main surfaces of the sheet material to expose portions of the tubular formations of metal originally within the pores.

5. An article according to claim 1, wherein the electrically insulating sheet material includes a closed cell porous structure in addition to the said pores containing the tubular formations of metal.

6. An article according to claim 1, in which the metal in at least some of the said pores is provided in two portions, a first portion being provided in contact with the interior pore surface, and a second portion being provided on at least one of the end faces of the first portion, at least the second portion projecting beyond at least one of the surfaces of the sheet material.

7. An article according to claim 1, which the tubular formations of metal are provided in their respective pores by plating.

8. An electrical device which comprises:
   (a) two electrically interconnected components, each having at least one connection site through which it is connected to the other component; and
   (b) an article according to claim 1, which is positioned so that each of the connection sites on the respective components is in contact with respective opposite ends of at least one of the tubular formations of metal.

9. An electrical device according to claim 8, in which each of the connections sites is in contact with respective opposite ends of a plurality of the tubular formations of metal.

10. An article according to claim 1, in which the pores have a diameter of from 5 to 200 micrometers.

11. A method of making a uniaxially electrically conductive article, comprising:
   (a) applying a metal substantially only to the interior surface of pores formed by ultraviolet laser ablation in a selected portion of an electrically insulating sheet material of 8 to 800 micrometers thickness, the said portion having at least 25 substantially non-interconnected pores having a mean diameter of 1 to 200 micrometers per square millimeter of its surface such that the metal in each pore provides a separate electrically conductive path between the main surfaces of the sheet material; and (b) removing insulating material from at least one surface region of the sheet material so as to expose portions of the metal that were previously within the pores.

12. A method according to claim 11, which includes the step of forming the pores in the sheet material by the said laser ablation.

13. A method according to claim 11, in which the pores have a diameter of from 5 to 200 micrometers.

14. A method of making a uniaxially electrically conductive article, which comprises:

(a) providing a sheet of electrically insulating material of 8 to 800 micrometers thickness;

(b) forming in at least a portion of the sheet at least about 25 substantially straight-through non-interconnected pores of 1 to 200 micrometers diameter per square millimeter of its surface by ultraviolet laser ablation, the pores extending from one surface to the other surface of the sheet; and (c) applying metal substantially only to at least part of the interior surface of at least some of the pores, the metal in each such pore being electrically separate from that in every other pore.

15. A method according to claim 14, in which the metal is provided on the interior surface of the pores by plating.

16. A method according to claim 14, which includes the step of removing material from at least one surface of the sheet material so as to expose portions of the metal that were previously within the pores.

17. A method according to claim 16, in which the portion of the sheet in which the pores are formed is defined by a screen, which defines a pattern of pores to be formed in the sheet.

18. A method according to claim 14, in which the pores are tapered inwardly from one surface of the sheet towards the other surface of the sheet.

19. A method as claimed in claim 14, which includes the step of removing material from both surfaces of the sheet material so as to expose portions of the metal that were previously within the pores.

20. A method as claimed in claim 14, which includes the step of providing a material within the pores which have a metal layer on their internal surface.

21. A method as claimed in claim 20, in which the said material is a solder.

22. A method as claimed in claim 20, in which the said material is applied to the metal of the layer on the internal surface of the pores by plating.

23. A method as claimed in claim 20, in which the said material substantially fills the pores in which it is provided.

24. A uniaxially electrically conductive article comprising porous electrically insulating sheet material, at least a portion of which has at least 25 substantially straight-through non-interconnected pores per square millimeter of its surface, at least some of the pores containing:

(a) a tubular first formation of metal which provides an electrically conductive path between, and projects beyond at least one of, the main surfaces of the sheet material, the metal being substantially only within the pores and, each such conductive path being electrically separate from substantially all the other such conductive paths, and (b) a second portion of a material that is also substantially only within the pores and is in contact with the interior surface of the tube provided by the first portion.

25. An article according to claim 24 wherein the second portion of material is also tubular.

26. An article according to claim 24 wherein the material of the said second portion is different from the electrically conductive material of the said first portion.

27. An article as claimed in claim 24, in which the second material substantially fills the tube provided by the first formation.

28. An article as claimed in claim 24, in which the second material is applied to the tubular first formation by plating.

29. An article as claimed in claim 24, in which each of at least a significant proportion of the pores contains a tubular first formation of metal.

30. An article as claimed in claim 24, in which the pores have been formed by ultraviolet laser ablation.

31. An article as claimed in claim 24, in which the second material is a metal having a melting point lower than that of the metal of the first formation.

32. An article as claimed in claim 31, in which the second material is a solder.

* * * * *

UNITED STATES PATENT AND TRADEMARK OFFICE
CERTIFICATE OF CORRECTION

PATENT NO. : 5,262,718
DATED : Nov. 16, 1993
INVENTOR(S) : Svendsen, et al

It is certified that error appears in the above-indentified patent and that said Letters Patent is hereby corrected as shown below:

Column 2, line 14, replace "millimeters" by --micrometers--.

Column 5, line 30, replace "us" by --use--.

Column 6, line 41, replace "fi ally" by --finally--.

Signed and Sealed this

Twenty-sixth Day of July, 1994

Attest:

BRUCE LEHMAN

Attesting Officer     Commissioner of Patents and Trademarks